(12) United States Patent
Yang et al.

(10) Patent No.: US 9,385,710 B2
(45) Date of Patent: Jul. 5, 2016

(54) TOUCH SCREEN, ELECTRONIC DEVICE COMPRISING SAME AND METHOD FOR MANUFACTURING SAME

(71) Applicant: BEIJING BOE OPTOELECTRONICS TECHNOLOGY CO., LTD., Beijing (CN)

(72) Inventors: Shengji Yang, Beijing (CN); Haisheng Wang, Beijing (CN); Yingming Liu, Beijing (CN)

(73) Assignee: BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 138 days.

(21) Appl. No.: 14/127,333

(22) PCT Filed: Nov. 27, 2012

(86) PCT No.: PCT/CN2012/085371
§ 371 (c)(1),
(2) Date: Dec. 18, 2013

(87) PCT Pub. No.: WO2014/008733
PCT Pub. Date: Jan. 16, 2014

(65) Prior Publication Data
US 2015/0027870 A1  Jan. 29, 2015

(30) Foreign Application Priority Data

Jul. 13, 2012  (CN) .......................... 2012 1 0244272

(51) Int. Cl.
| | |
|---|---|
| H01H 13/70 | (2006.01) |
| H01H 25/00 | (2006.01) |
| H01H 25/04 | (2006.01) |
| H03K 17/96 | (2006.01) |
| G06F 3/041 | (2006.01) |
| G06F 3/044 | (2006.01) |

(52) U.S. Cl.
CPC ............ *H03K 17/9618* (2013.01); *G06F 3/041* (2013.01); *G06F 3/044* (2013.01); *G06F2203/04111* (2013.01); *H03K 2017/9613* (2013.01); *H03K 2217/96015* (2013.01); *Y10T 29/49105* (2015.01)

(58) Field of Classification Search
CPC ........ G06F 3/041; H01H 13/70; H01H 25/00; H01H 25/04; H01H 1/00; H01H 13/702; H01H 13/703; H01H 13/704; H01H 2239/074; H01H 2203/008; H01H 2207/01; H01H 2221/00; H01H 2231/002; H01H 2231/012; H01H 2231/016; H01H 2231/052; H01H 2239/006; H01H 2229/034
USPC ......... 200/5 R, 305, 510, 520, 530, 556, 562, 200/244, 308, 314, 341, 600, 46, 5 A, 292, 200/243; 345/173
See application file for complete search history.

(56) References Cited

U.S. PATENT DOCUMENTS

| | | | |
|---|---|---|---|
| 6,862,050 B2* | 3/2005 | Rho et al. ......................... 349/44 |
| 7,626,202 B2* | 12/2009 | Yamazaki ........... G02F 1/13454 257/59 |
| 7,864,503 B2* | 1/2011 | Chang ........................... 361/288 |
| 2013/0105294 A1* | 5/2013 | Ye .......................... G06F 3/044 200/600 |

FOREIGN PATENT DOCUMENTS

CN             202084018 U       12/2011

OTHER PUBLICATIONS

First Chinese Office Action Appln. No. 201210244272.7; Dated Sep. 18, 2014.
International Preliminary Report on Patentability dated Jan. 13, 2015; PCT/CN2012/086371
International Search Report issued Apr. 11, 2013: PCT/CN2012/085371.

* cited by examiner

Primary Examiner — Renee Luebke
Assistant Examiner — Anthony R. Jimenez
(74) Attorney, Agent, or Firm — Ladas & Parry LLP

(57) ABSTRACT

Embodiments of the present invention provide a touch screen, an electronic device comprising the same and a method for manufacturing the same. The touch screen comprises driving electrode layers, a transparent organic polymer layer and metal bridges conductively communicated with two adjacent driving electrode layers, and protective layers covering the metal bridges to prevent the oxidation of the metal bridges are disposed between the driving electrode layers and the metal bridges. In the touch screen provided by the embodiment of the present invention, as the metal bridges are respectively covered by the protective layers, the metal bridges will not undergo oxidation reaction due to the contact of transparent organic polymers, and thus the electric conductivity of the metal bridges can be effectively guaranteed; the increase of the impedance of oxide layers can be avoided; and the product yield of the touch screen can be improved.

12 Claims, 2 Drawing Sheets

Step 101, forming black matrix layers, disposed in frame areas, on a transparent substrate by one patterning process.

Step 102, forming a thermosetting transparent organic polymer layer covering the substrate, and forming underlying ITO layers disposed on the thermosetting transparent organic polymer layer, metal bridges disposed on the underlying ITO layers, and protective layers disposed on the metal bridges, by a second patterning process, wherein the protective layers are configured to prevent the oxidation of the metal bridges and have electric conductivity.

Step 103, forming a transparent organic polymer layer, disposed on the protective layers and configured to cover the substrate, by a third patterning process, wherein the transparent organic polymer layer is provided with through holes on the protective layers.

Step 104, forming a plurality of sensing electrode layers arranged at intervals and in parallel and a plurality of driving electrode layers respectively spaced by the sensing electrode layers, disposed on the transparent organic polymer layer, by a forth patterning process, wherein each of the driving electrode layers makes conductive contact with the respective protective layer via one of the through holes.

Fig. 4

TOUCH SCREEN, ELECTRONIC DEVICE COMPRISING SAME AND METHOD FOR MANUFACTURING SAME

TECHNICAL FIELD

Embodiments of the present invention relate to a touch screen, an electronic device comprising the same, and a method for manufacturing the same.

BACKGROUND

With the development and application of the computer technology and various electronic devices, touch screens, as a kind of human-computer interaction device, have been more and more widely applied in various computers and electronic devices. As one of the latest input device, the touch screens are currently the most simple, convenient and natural human-computer interaction mode. By utilization of this kind of technology, users can operate hosts simply by using fingers to touch icons or texts on the touch screen, which allows the human-machine interaction to be more straightforward and greatly facilitates users who do not know how to operate computers.

The wide application of the touch screens also promotes the technical progress of the touch screens and has been constantly pushing people to improve the manufacturing technique of the touch screens. As illustrated in FIG. 1 which is a schematic structural view of a touch screen currently under development and research, the touch screen comprises a glass substrate 8', black matrix layers 7', a thermosetting transparent organic polymer layer 6', underlying ITO layers 5', metal bridges 4', a transparent organic polymer layer 3', sensing electrode layers 2' and driving electrode layers 1'.

The inventors of the present application found that: in the current structure of the touch screen, the metal bridges are usually directly covered by the transparent organic polymer layer; but as the transparent organic polymer layer is also subjected to post-baking process after exposure and development to form though holes, part of the transparent organic polymer layer at the position of the through holes, adjacent to the metal bridges, will be subjected to sideslip and react with the metal bridges. Therefore, metal oxide layers with large impedance can be formed on surfaces of the metal bridges and reduce the electric conductivity of the metal bridges, and thus the product performance of the touch screen can be reduced or failure can be incurred.

SUMMARY

Embodiments of the present invention provide a touch screen, an electronic device comprising the same and a method for manufacturing the same, which are used for reducing the failure rate of the touch screen and improving the product performance of the touch screen.

The touch screen provided by an embodiment of the present invention comprises a plurality of sensing electrode layers arranged at intervals and in parallel, a plurality of driving electrode layers respectively spaced by the sensing electrode layers, metal bridges conductively communicated with two driving electrode layers arranged in parallel on both sides of same one sensing electrode layer, and protective layers configured to prevent the oxidation of the metal bridges, having electric conductivity, and respectively disposed between the driving electrode layers and the metal bridges.

In the process of manufacturing the touch screen, due to the protective layers, the case can be avoided that the metal bridges are oxidized by reacting with other substances when the metal bridges are exposed, and thus the electric conductivity of the metal bridges can be guaranteed; the product rejection rate due to the oxidation of the metal bridges can be reduced; and the product yield can be improved.

In an embodiment, the protective layers may be made of indium tin oxide (ITO) or indium zinc oxide (IZO).

ITO or IZO has electric conductivity, has good metal adhesion ability, and can well isolate transparent organic polymers and prevent the reaction between the transparent organic polymers and the metal bridges.

An embodiment of the present invention further provides an electronic device comprising the touch screen as illustrated in the foregoing technical proposal.

An embodiment of the present invention provides a method for manufacturing a touch screen, which comprises:

forming black matrix layers, disposed in frame areas, on a transparent substrate by one patterning process;

forming a thermosetting transparent organic polymer layer covering the substrate, forming underlying ITO layers disposed on the thermosetting transparent organic polymer layer, metal bridges disposed on the underlying ITO layers, and protective layers disposed on the metal bridges, by one patterning process, wherein the protective layers are configured to prevent the oxidation of the metal bridges and have electric conductivity;

forming a transparent organic polymer layer, disposed on the protective layers and configured to cover the substrate, by one patterning process, wherein the transparent organic polymer layer is provided with through holes on the protective layers; and forming a plurality of sensing electrode layers arranged at intervals and in parallel and a plurality of driving electrode layers respectively spaced by the sensing electrode layers, disposed on the transparent organic polymer layer, by one patterning process, wherein each driving electrode layer makes conductive contact with the respective protective layer via a through hole.

In an embodiment, the protective layers may be made of ITO or IZO.

In the touch screen provided by the embodiment of the present invention, as the metal bridges are respectively covered by the protective layers, the metal bridges will not undergo oxidation reaction due to the contact of transparent organic polymers, and thus the electric conductivity of the metal bridges can be effectively guaranteed; the production of the impedance of oxide layers can be avoided; and the product yield of the touch screen can be improved.

BRIEF DESCRIPTION OF THE DRAWINGS

Simple description will be given below to the accompanying drawings of the embodiments to provide a more clear understanding of the technical proposals of the embodiments of the present invention. It will be obvious to those skilled in the art that the drawings described below only involve some embodiments of the present invention but are not intended to limit the present invention. In which:

FIG. 4 is a flow chart diagram of the steps of manufacturing a touch screen.

DETAILED DESCRIPTION

Figure 1:
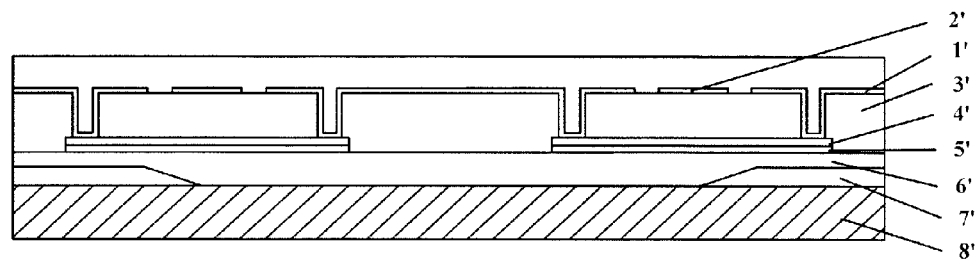
FIG. 1 is a schematic diagram of a layer structure of a touch screen in the art of state.

For more clear understanding of the objectives, technical proposals and advantages of the embodiments of the present invention, clear and complete description will be given below to the technical proposals of the embodiments of the present invention with reference to the accompanying drawings of the embodiments of the present invention. It will be obvious to those skilled in the art that the preferred embodiments are only partial embodiments of the present invention but are not all the embodiments. All the other embodiments obtained by those skilled in the art without creative efforts on the basis of the illustrated embodiments of the present invention shall fall within the scope of protection of the present invention.

In the current structure of the touch screen, metal bridges are generally directly covered by a transparent organic polymer layer; but as the transparent organic polymer layer is also subjected to post-baking process after exposure and development to form through holes, the objective which is to increase the transmittance and the hardness of the transparent organic polymers, and part of the transparent organic polymer layer at the position of the through holes, adjacent to the metal bridges, will be subjected to sideslip and react with the metal bridges in the post-baking process, metal oxide layers with large impedance can be formed on the metal bridges, and thus the electric conductivity of the driving electrode layers and the metal bridges can be reduced or hindered, and consequently the product performance of the touch screen can be reduced or the failure can be caused. In an embodiment of the present invention, protective layers having the protective function and the electric conductivity are additionally disposed on the metal bridges, so that the transparent organic polymer layer will not contact the metal bridges even in the case of sideslip, and thus it can be guaranteed that the metal bridges cannot be oxidized, and consequently the product yield can be improved.

Detailed description will be given below to the embodiments of the present invention. Examples of the embodiments are illustrated in the accompanying drawings, in which the same or similar reference numerals represent the same or similar elements or elements with the same or similar functions although the disclosure. The embodiments described below with reference to the accompanying drawings are illustrative and only used for illustrating the present invention but cannot be construed to the limitations on the present invention.

In the description of the embodiments of the present invention, the orientation or position relationship indicated by the terms "upper", "lower", "on", "under", etc. is based on the orientation or position relationship as illustrated in the accompanying drawings. These terms are only used to illustrate the embodiments of the present invention but do not require the embodiments of the present invention to be constructed and operated at specific orientations, and thus cannot be construed to the limitations on the present invention.

Figure 2:
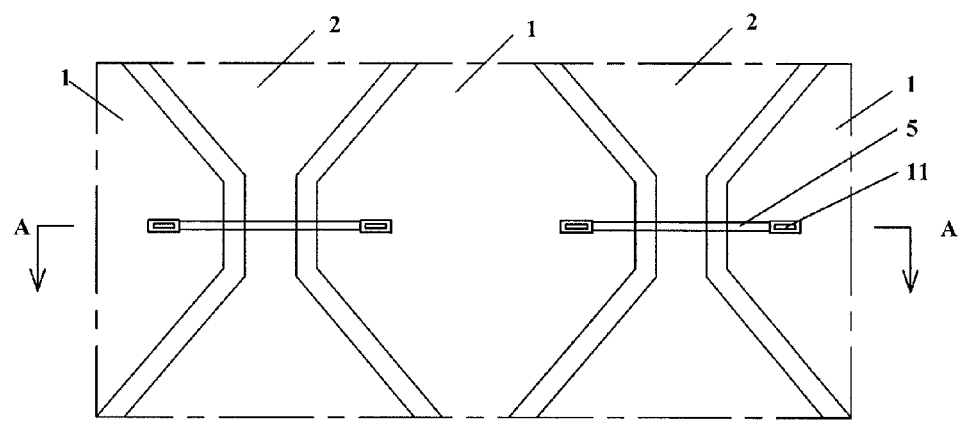
FIG. 2 is a top view of a local structure of a touch screen provided by an embodiment of the present invention.
Figure 3:
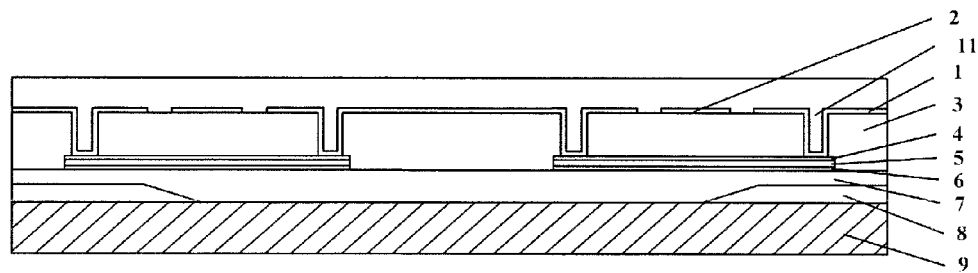
FIG. 3 is a schematic structural sectional view of an A-A position of FIG. 2.

As illustrated in FIG. 2, a touch screen provided by an embodiment of the present invention comprises a plurality of sensing electrode layers 2 arranged at intervals and in parallel, a plurality of driving electrode layers 1 respectively spaced by the sensing electrode layers 2, and metal bridges 5 conductively communicated with two driving electrode layers 1 arranged in parallel on both sides of same one sensing electrode layer 2. As illustrated in FIG. 3, the touch screen further comprises protective layers 4 configured to prevent the oxidation of the metal bridges 5, having electric conductivity, and respectively disposed between the driving electrode layers 1 and the metal bridges 5.

The method for manufacturing the touch screen, provided by the embodiment of the present invention and in conjunction with FIG. 4, comprises the following:

step 101: forming black matrix layers, disposed in frame areas, on a transparent substrate by one patterning process;

step 102: forming a thermosetting transparent organic polymer layer covering the substrate, and forming underlying ITO layers disposed on the thermosetting transparent organic polymer layer, metal bridges disposed on the underlying ITO layers, and protective layers disposed on the metal bridges, by one patterning process, in which the protective layers are configured to prevent the oxidation of the metal bridges and have electric conductivity;

step 103: forming a transparent organic polymer layer, disposed on the protective layers and configured to cover the substrate, by one patterning process, wherein the transparent organic polymer layer is provided with through holes on the protective layers; and step 104: forming a plurality of sensing electrode layers arranged at intervals and in parallel and a plurality of driving electrode layers respectively spaced by the sensing electrode layers, disposed on the transparent organic polymer layer, by one patterning process, wherein each drive electrode makes conductive contact with the protective layer via a through hole.

The method for manufacturing the touch screen is further described below in conjunction with FIGS. 2 and 3.

In the process of manufacturing the touch screen, firstly, black matrix layers 8 are required to be coated in frame areas of a transparent substrate 9, and the main objective of coating the black matrix layers 8 is to shield peripheral metal wires and peripheral light leakage areas.

Secondly, a thermosetting transparent organic polymer layer 7 capable of covering the whole transparent substrate 9 is coated on the black matrix layers 8. Therefore, not only the edges of the black matrix layers 8 can be planarized but also the pollution of produced residues and oil stains on chambers of subsequent sputtering equipment can be avoided as the black matrix layers 8 are covered by the thermosetting transparent organic polymer layer 7.

Thirdly, an underlying ITO film 6 may be sputtered on the thermosetting transparent organic polymer film 7, and a metal film is subsequently sputtered on the underlying ITO film 6. The main function of the underlying ITO film 6 is to prevent the chamber from being polluted due to the direct impact of metal ions on the thermosetting transparent organic polymer layer in the sputtering of the metal layer.

Fourthly, the metal film is continuously covered by a protective film 4. The main function of the protective film 4 is to isolate metal bridges 5 so that the metal bridges 5 cannot contact and react with other substances. In the art of state, the driving electrode layers 1 make direct contact with the metal bridges 5 via through holes 11, and the conduction between drive electrodes on the same row can be achieved through the metal bridges 5. Therefore, in the embodiment of the present invention, the additionally disposed protective film 4 should have the characteristics that: the protective film 4 not only can protect the metal bridges 5 from being oxidized but also are conductive so that the conduction between the driving electrode layers 1 and the metal bridges 5 can be achieved. Moreover, the protective film 4 may directly cover the metal bridges 5. In the actual application, the protective layers 4 may be made of ITO. The reasons include as follows: as ITO has good adhesion with the metal layers, the metal film can be well protected; and as ITO has electric conductivity, the conduction between the driving electrode layers 1 and the metal bridges 5 cannot be affected. In addition, the protective layers may also be made of IZO.

Fifthly, when the protective film 4, the metal film and the underlying ITO film 6 are all sputtered, a layer of photoresist is coated on the protective film, and then exposure, development, etching, photoresist removing and other processes can be performed on the three-layer structure by same one mask to retain required parts. At this point, the etched metal film forms the structure of the metal bridges 5. Subsequently, a transparent organic polymer layer 3 covering the whole substrate is coated continuously; and after the transparent organic polymer layer 3 is coated, the transparent organic polymer layer 3 is also subjected to exposure and development to faun through holes 11 which are directly opposite to the metal bridges 5 in the vertical direction; the through holes 11 are formed deeply to contact the protective layers 4. Then, a transparent conductive film is deposited on the transparent organic polymer layer 3 and the protective layers 4, and patterns of the driving electrode layers 1 and the sensing electrode layers 2 are formed by a series of patterning processes such as exposure, development, etching and the like; the driving electrode layers 1 are conductively communicated with the protective layers 4 through the through holes 11, and the protective layers 4 may be also conductively communicated with the metal bridges 5, so that an overall conductive structure of the driving electrode layers 1, the protective layers 4 and the metal bridges 5 can be achieved, and the metal bridges 5 can connect the driving electrode layers 1 which are arranged in parallel on both sides of same one sensing electrode layer 2.

Finally, the formed overall structure is as follows: the sensing electrode layers 2 and the driving electrode layers 1 are disposed in the utmost top layer; the protective layers 4 are respectively disposed under the driving electrode layers 1 at the position of the through holes 11; the metal bridges 5 are respectively disposed under the protective layers 4; the underlying ITO layers 6 are respectively disposed under the metal bridges 5; the thermosetting transparent organic polymer layer 7 is disposed under the underlying ITO layers 6; the black matrix layers 8 are disposed in the peripheral areas under the thermosetting transparent organic polymer layer 7; and the transparent substrate 9 is disposed under the black matrix layers 8 and in the utmost bottom layer.

The metal bridges 5 may be made of aluminum, copper, aluminum neodymium alloy or the like and have the advantages of having good electric conductivity and being difficult to be oxidized.

In the touch screen provided by the embodiment of the present invention, the metal bridges are isolated from the ambient environment because they are covered by the protective layers, so that the metal bridges cannot be subjected to oxidation reaction due to the contact of the transparent organic polymers. Therefore, the electric conductivity of the metal bridges can be effectively guaranteed; the impedance of the oxide layers produced can be reduced; and the product yield of the touch screen can be improved.

The embodiment of the present invention further provides an electronic device comprising the touch screen, which has the advantages of good touch performance and low failure rate.

The foregoing is only the illustrative embodiments of the present invention and not intended to limit the scope of protection of the present invention. The scope of protection of the present invention is defined by the appended claims.

The invention claimed is:

1. A touch screen, comprising: a plurality of sensing electrode layers arranged at intervals and in parallel, a plurality of driving electrode layers respectively spaced by the sensing electrode layers, metal bridges conductively communicated with two driving electrode layers arranged in parallel on both sides of a single sensing electrode layer, and protective layers configured to prevent the oxidation of the metal bridges, having electric conductivity, and respectively disposed between the driving electrode layers and the metal bridges, wherein the driving electrode layers and the metal bridges are electrically connected by the protective layers, respectively.

2. The touch screen according to claim 1, wherein the metal bridges are respectively covered by the protective layers.

3. The touch screen according to claim 1, wherein the protective layers are made of indium tin oxide (ITO) or indium zinc oxide (IZO).

4. The touch screen according to claim 1, wherein the metal bridges are made of aluminum, copper or aluminum neodymium alloy.

5. The touch screen according to claim 1, further comprising underlying ITO layers respectively disposed under the metal bridges.

6. The touch screen according to claim 5, further comprising a thermosetting transparent organic polymer layer disposed under the underlying ITO layers.

7. The touch screen according to claim 6, further comprising black matrix layers respectively disposed under the thermosetting transparent organic polymer layer.

8. The touch screen according to claim 7, further comprising a transparent substrate disposed under the black matrix layers.

9. An electronic device comprising the touch screen according to claim 1.

10. A method for manufacturing a touch screen, comprising:
   forming black matrix layers, disposed in frame areas, on a transparent substrate by a first patterning process;
   forming a thermosetting transparent organic polymer layer covering the substrate, and forming underlying ITO layers disposed on the thermosetting transparent organic polymer layer, metal bridges disposed on the underlying ITO layers, and protective layers disposed on the metal bridges, by a second patterning process, wherein the protective layers are configured to prevent the oxidation of the metal bridges and have electric conductivity;
   forming a transparent organic polymer layer, disposed on the protective layers and configured to cover the substrate, by a third patterning process, wherein the transparent organic polymer layer is provided with through holes on the protective layers; and
   forming a plurality of sensing electrode layers arranged at intervals and in parallel and a plurality of driving electrode layers respectively spaced by the sensing electrode layers, disposed on the transparent organic polymer layer, by a fourth patterning process, wherein each of the driving electrode layers makes conductive contact with the respective protective layer via one of the through holes.

11. The manufacturing method according to claim 10, wherein forming the underlying ITO layers, the metal bridges and the protective layers by the second patterning process further comprises:
   depositing an underlying ITO film, a metal film and a protective layer film in turn, coating a photoresist on the protective layer film, and performing exposure, development and etching processes on the underlying ITO film, the metal film and the protective layer film by one mask plate to form the underlying ITO layers, the metal bridges and the protective layers.

12. The manufacturing method according to claim 10, wherein the protective layers are made of ITO or IZO.

* * * * *